United States Patent
Berroth et al.

(10) Patent No.: US 6,949,903 B2
(45) Date of Patent: Sep. 27, 2005

(54) METHOD AND APPARATUS FOR DIGITIZING A VOLTAGE

(75) Inventors: Hansjorg Berroth, Villingen-Schwenningen (DE); Arnold Kuner, St. Georgen (DE); Hans-Dieter Schondelmaier, St. Georgen (DE)

(73) Assignee: ebm-papst St. Georgen GmbH & Co. KG, St. Georgen (DE)

( * ) Notice: Subject to any disclaimer, the term of this patent is extended or adjusted under 35 U.S.C. 154(b) by 0 days.

(21) Appl. No.: 10/298,332

(22) Filed: Nov. 18, 2002

(65) Prior Publication Data

US 2003/0117098 A1 Jun. 26, 2003

(30) Foreign Application Priority Data

Dec. 22, 2001 (DE) ......................... 101 63 374

(51) Int. Cl.⁷ .............. H02P 1/00; H02P 3/00; H02P 5/00; H02P 7/00
(52) U.S. Cl. ............. 318/440; 318/471; 318/268; 341/126; 341/155; 341/166; 341/158
(58) Field of Search .................. 341/172, 120, 341/128, 166, 126, 154–158, 118; 318/471, 268, 440, 700, 254, 439, 599; 701/99

(56) References Cited

U.S. PATENT DOCUMENTS

| | | | | | |
|---|---|---|---|---|---|
| 4,763,347 | A | * | 8/1988 | Erdman ............... | 318/254 |
| 4,857,931 | A | * | 8/1989 | Gulczynski ........... | 341/156 |
| 5,014,058 | A | * | 5/1991 | Horn .................. | 341/166 |
| 5,099,241 | A | * | 3/1992 | Gulczynski ........... | 341/159 |
| 5,206,649 | A | * | 4/1993 | Gulczynski ........... | 341/156 |
| 5,216,426 | A | * | 6/1993 | Ishioka ............... | 341/168 |
| 5,313,208 | A | | 5/1994 | Bellini ............... | 341/166 |
| 5,831,568 | A | | 11/1998 | Mohr .................. | 341/166 |
| 6,229,472 | B1 | * | 5/2001 | Nishida ............... | 341/161 |
| 6,452,349 | B1 | * | 9/2002 | Hahn et al. .......... | 318/254 |
| 6,492,929 | B1 | * | 12/2002 | Coffey et al. ........ | 341/155 |
| 6,496,340 | B1 | | 12/2002 | Hornberger et al. .... | 361/51 |

FOREIGN PATENT DOCUMENTS

| | | |
|---|---|---|
| DE | 44 23 955 A | 1/1996 |
| DE | 198 36 882 A1 | 2/2000 |
| JP | 64-78030 A1 | 3/1989 |

OTHER PUBLICATIONS

English abstract of ISHIGURO/SANYO Pub. #010–78030–A of Mar. 23, 1989, entitled "A/D Converting Circuit", retrieved from DEPATISNET database of German Patent Office.
"PIC16C62X EEPROM–Based 8–Bit CMOS Microcontrollers" datasheet pp. 1–18 & 113–116 from Microchip Technology, Inc., Chandler, Arizona, 2002.

\* cited by examiner

*Primary Examiner*—David Martin
*Assistant Examiner*—Renata McCloud
(74) *Attorney, Agent, or Firm*—Milton Oliver, Esq.; Ware Fressola Van Der Sluys & Adolphson LLP

(57) ABSTRACT

When digitizing a voltage, a capacitor is charged, through an impedance, to a voltage value (Um) dependent on the voltage to be digitized. The limits of that one of a plurality of voltage ranges in which said voltage value (Um) lies, are ascertained, and the two limits of that voltage range are defined as a first limit and second limit; the voltage at the capacitor is modified to the first limit by a charge modification circuit containing an impedance, and a first time interval needed therefor is identified; the voltage at the capacitor is modified to the second limit; the voltage at the capacitor is modified from the second to the first limit via the charge modification circuit. A seond time interval needed therefor is identified. Based on values of the first time interval and second time interval, a digital value is calculated, which serves as an indication of how much the voltage value (Um) at the capacitor differs from one of said two limits.

12 Claims, 8 Drawing Sheets

| HALL-CTR 168 | Flag_IW_Done | Branch |
|---|---|---|
| xx00 | 0 | 258 |
| xx01 | 1 | 254 |
| xx10 | 1 | 246 |
| xx11 | 0 | 246 |
| xx00 | 0 | 258 |
| xx01 | 1 | 254 |
| xx10 | 1 | 246 |
|  | 0 | 246 |
| ... | ... | ... |

Fig. 7

मेथड AND APPARATUS FOR DIGITIZING A VOLTAGE

METHOD AND APPARATUS FOR DIGITIZING A VOLTAGE

FIELD OF THE INVENTION

The invention relates generally to a method for digitizing the voltage at a capacitor, and a device for carrying out such a method and, more particularly, to the application of such a method and device for controlling the rotation speed of a fan driven by an electronically commutated DC motor.

BACKGROUND

For digitization of an analog voltage, many microcontrollers ($\mu$Cs) are equipped with an A/D converter that allows a relatively coarse conversion, e.g. to 4-bit accuracy. A substantially greater accuracy (e.g. 8 bits) is usually needed for digital controllers, however, and consequently requires a higher-resolution A/D conversion than is possible with the hardware of such a $\mu$C.

SUMMARY OF THE INVENTION

An object of the invention is therefore to make available a new method for digitization, as well as a device for carrying out such a method.

According to the invention, this object in achieved by first coarsely classifying the voltage on the capacitor into one of a plurality of contiguous voltage ranges, each defined by a respective first limit and a respective second limit, to derive the Most Significant Bits (MSB) of the digitized voltage value, and then modifying the capacitor voltage within the identified range, measuring the time intervals needed to do so. The results of the measurements are used to derive Least Significant Bits (LSB) of the digitized voltage value, thus increasing accuracy.

Determination of the first and second limits can be accomplished with the hardware present in many microcontrollers, and the result is a coarse digitization, i.e. a coarse datum. Subsequent active modification of the voltage at the capacitor enables a more accurate measurement in which the size of that capacitor affects only how long the measurement lasts, but not its accuracy. Deviation of the capacitor value from its nominal value thus does not create an accuracy problem. It is thereby possible to increase the A/D conversion accuracy with very simple means and substantially without additional cost, since what is now obtained, in addition to the coarse datum regarding the first and second limits, is a fine datum, concerning the magnitude of the voltage value at the capacitor, within the range between the first and second limits.

A device according to the present invention has a charging circuit, including an impedance, for charging the capacitor to the value to be digitized, charge modification apparatus for modifying the capacitor voltage successively to respective ends of the voltage range, measuring the time intervals (T1, T2) required, and a calculation apparatus for deriving additional bits of the digitized voltage value, based upon the values of the aforementioned time intervals. An arrangement of this kind has a very simple configuration with high measurement accuracy.

A preferred use or application for the invention is in the control of the rotation speed of a fan driven by an electronically commutated motor (ECM).

BRIEF FIGURE DESCRIPTION

Further details and advantageous developments of the invention are evident from the exemplary embodiment described below and depicted in the drawings, which is in no way to be understood as a limitation of the invention.

FIG. 7 is a table explaining FIG. 6; and

DETAILED DESCRIPTION OF A PREFERRED EMBODIMENT

Figure 1:
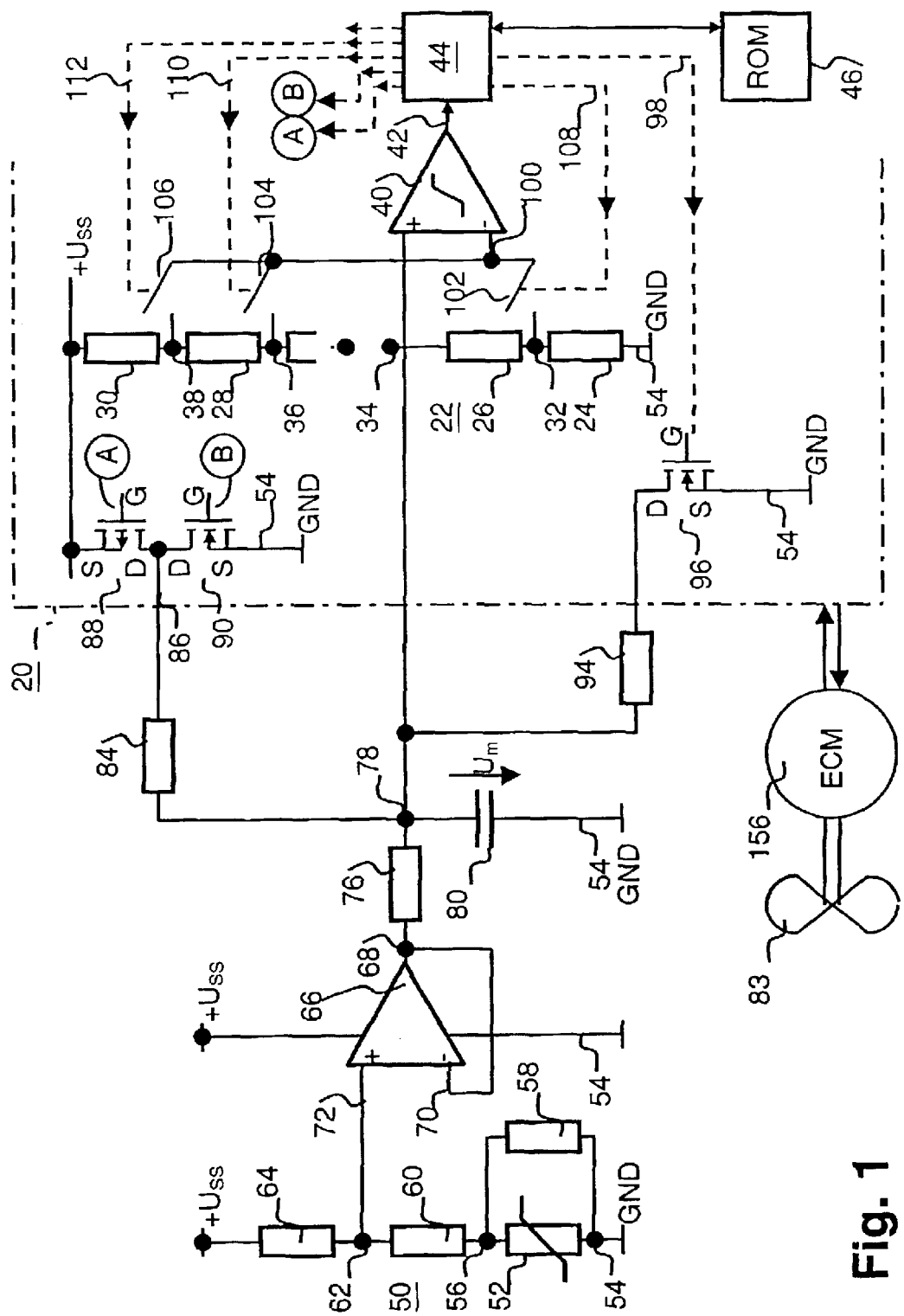
FIG. 1 is schematic diagram of the device of the present invention for digitizing an analog measured voltage.

FIG. 1 shows, at the right, a computer 20, e.g. a Microchip 16C621A $\mu$C from the Microchip company of Chandler, Ariz. This contains a resistor chain 22 which is at a constant voltage Uss of e.g. +3.0 V and contains fifteen resistors that are partially indicated at 24, 26, 28, 30. Some of the nodes between these resistors are indicated at 32, 34, 36, 30. FIG. 1 shows only a small portion of this resistor chain 22.

$\mu$C 20 furthermore contains a comparator 40 whose output 42 is connected to switching logic (ALU) 44 of $\mu$C 20, associated with which is a program in a ROM 46, which in this case is preferably a constituent of $\mu$C 20 and usually is programmed when the latter is manufactured.

The device in the embodiment shown in FIG. 1 serves to digitize a potential at a node 62 of a voltage divider 50. The latter contains an NTC (Negative Temperature Coefficient) resistor 52 which is arranged between ground 54 and a node 56 and has connected in parallel with it a resistor 58 whose function is to optimize the range of the output signals of voltage divider 50 for subsequent digitization.

Node 56 is connected via a resistor 60 to node 62, and the latter is connected via a resistor 64 to regulated voltage Uss.

A comparator 66 is wired as an impedance converter by the fact that its output 68 is connected to negative input 70. Positive input 72 is connected to node 62. The function of resistor 60 is evident here: if NTC resistor 52 is short-circuited by a fault, resistor 60 causes the potential obtained at node 62 to be different from that at ground, thus preventing a fault state from being reported during digitization. This is a "fail-safe" feature.

Impedance converter 66 is thus controlled by the potential at node 62, but prevents the occurrence of any feedback from its output to NTC resistor 52.

Output 68 of impedance converter 66 is connected via a resistor 76 to a node 78 that is connected via a capacitor 80 to ground 54.

In operation, capacitor 80 charges, through impedance converter 66 and resistor 76, to a voltage value Um that is a function of the potential at node 62, i.e. a function of the temperature at NTC resistor 52. This voltage value Um at capacitor 80 is digitized by the device shown in FIG. 1, i.e. converted into a numerical value that then serves, for example, as the basis for generating a target value for the rotation speed of an electronically commutated motor (ECM) 156. The latter can serve, for example, to drive a fan 83 that, like motor 156, is indicated only symbolically. For example, fan 83 is given a low rotation speed when the temperature at NTC resistor 52 is low, and a high rotation speed when that temperature is high.

Node 78 is connected to the positive input of comparator 40, and is connected, via a resistor 84 whose resistance is low by comparison with resistor 76, to a node 86 to which is connected drain terminal D of a p-channel MOSFET (Metal Oxide Semiconductor Field Effect Transistor) 88 whose source S connects to +Uss and to which is connected drain terminal D of an n-channel MOSFET 90 whose source S is connected to ground 54, MOSFETs 88, 90 are constituents of $\mu$C 20, and their gates G are controlled by the latter's arithmetic & logic unit (ALU) 44, via the connections shown symbolically at A and B, in accordance with the program (FIG. 3) in ROM (Read Only Memory) 46.

Node 78 is also connected, via a resistor 94, to the drain terminal of an n-channel MOSFET 96 (in $\mu$C 20) whose source S is connected to ground 54. Gate G of transistor 96 is controlled by logic unit 44 via a connection 98.

Negative input 100 of comparator 40 can be connected via an electronic switch 102 to node 32, likewise via an electronic switch 104 to node 36, likewise via an electronic switch 106 to node 38 (and analogously, via additional switches that are not depicted, to the other nodes of resistor chain 22).

Electronic switch 102 is controlled by logic unit 44 via an effective connection 108. Electronic switch 104 is likewise controlled by logic unit 44 via an effective connection 110, and electronic switch 106 via an effective connection 112, and likewise for all the other electronic switches.

Manner of Operation

Figure 2:
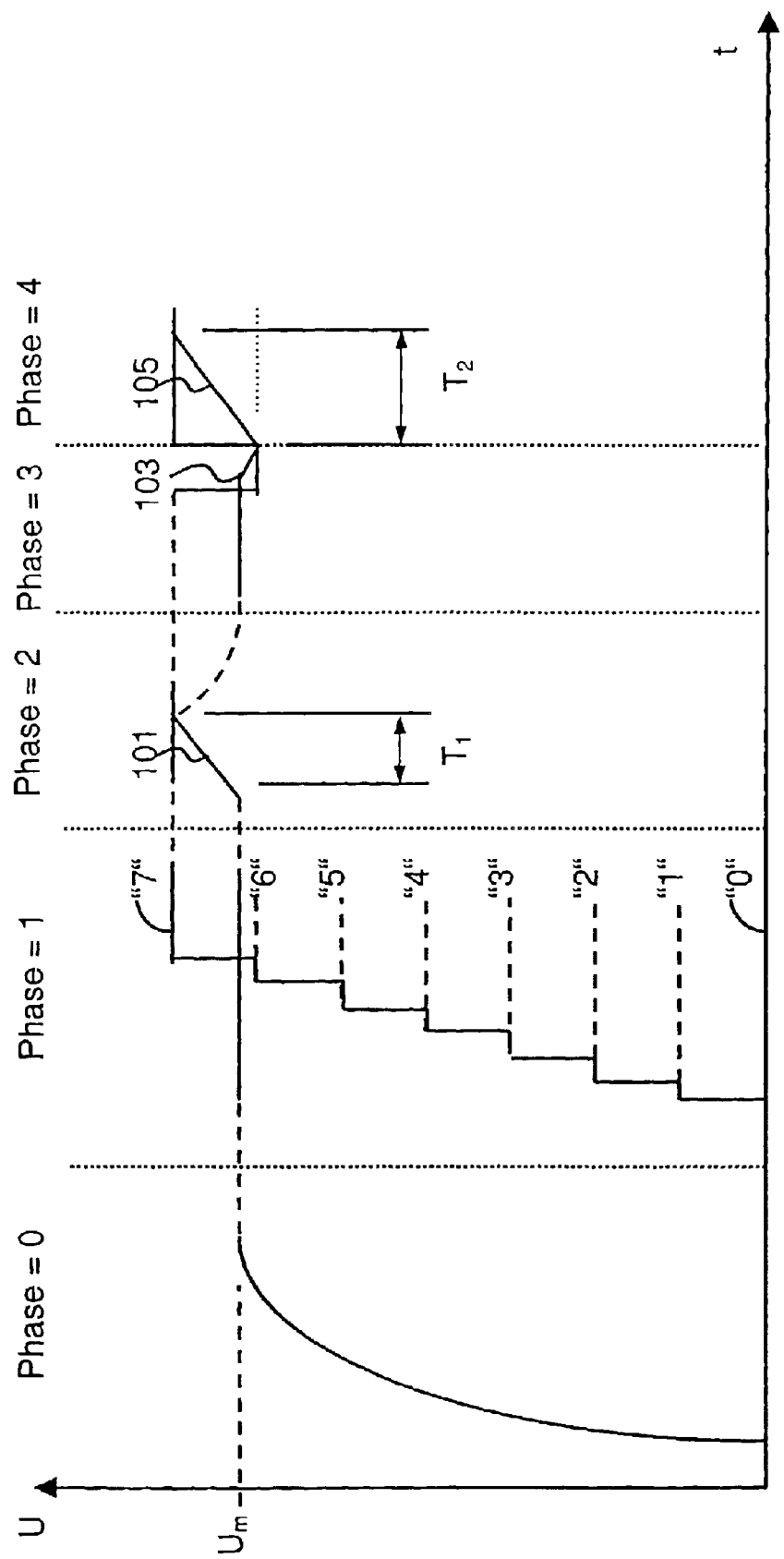
FIG. 2 is a schematic depiction explaining execution of the method.

As shown in FIG. 2, firstly, in a Phase=0, capacitor 80 is charged through impedance converter 66 and impedance 76 to a voltage value Um that, in the exemplary embodiment, is a function of the temperature at NTC resistor 52.

Then, in a Phase=1, resistor chain 24, 26, . . . 28, 30 is used to determine which of several voltage ranges contains said voltage value Um.

The potential is 0 V at ground 54, 0.2 V at node 32, 0.4 V at node 34, and so on up to 2.6 V at node 36 and 2.8 V at node 38.

When switch 102 is closed, the negative input of comparator 40 receives a potential of +0.2 V; and if the potential at node 78 is greater than 0.2 V, there is then no change at output 42 of comparator 40.

For the coarse measurement, the various electronic switches 102, 104, 106, etc. are individually closed successively. If the potential at node 36 (2.6 V) is still lower than voltage value Um at capacitor 80, but the potential at node 38 (2.8 V) is higher, it is then apparent that voltage value Um must lie between 2.6 and 2.8 V, i.e. the lower limit of the ascertained voltage range is 2.6 V, and the upper limit is 2.8 V. This yields a coarse digitization of the voltage value Um; in other words, the most significant bits (MSBs) are thus obtained upon digitization.

Then, in a Phase=2 (FIG. 2), transistor 88 is switched on while transistor 90 remains blocked. This causes capacitor 80 to charge through transistor 88 and resistor 84, as depicted in FIG. 2 at 101. Electronic switch 106 remains closed, and when the potential at the positive input of comparator 40 reaches a value of 2.8 V, comparator 40 switches over and transistor 88 is once again made nonconductive by logic unit 44 and its effective connection A. The time interval T1, during which transistor 88 is closed, is measured and stored.

Capacitor 80 is then discharged through resistor 84 and transistor 90 to the lower limit of the voltage range, i.e. in this example to +2.6 V, as depicted at 103 in FIG. 2. The voltage at capacitor 80 is then 2.6 V. During this process, switch 106 is opened and switch 104 is closed.

Transistor 90 is then blocked, transistor 88 is switched on, switch 104 is opened, and switch 110 is switched on. This is done by logic unit 44 under the control of the program in ROM 46.

As a result, capacitor 80 is charged via transistor 88 and resistor 84 from +2.6 V to +2.8 V, as depicted at 105 in FIG. 2, and a time interval T2, during which transistor 88 is conductive, is measured. This occurs in Phase=4 (FIG. 2).

The reason for the various phases in FIG. 2 is as follows: when the invention is utilized in an electronically commutated motor 156, which is a preferred application, $\mu$C 20 must also perform many other tasks, e.g. commutating motor 156, regulating its rotation speed, limiting its current, etc.; it is therefore advantageous to divide the measurement described above into a number of short modules that can be executed not in direct succession, but with small time gaps. $\mu$C 20 then always has computation time available to perform other time-critical functions in the interim. The fact that the measurement can be subdivided into a number of short modules therefore represents a great advantage of the method and the device according to the present invention.

Once time intervals T1 and T2 have been measured, the value for the least significant bits (LSBs) is calculated from them using the formula $$LSBs = (T2-T1)/T2 * 16 \qquad (1)$$

For example, if T1=T2, equation (1) yields the binary value 0000b.

Since the charging process through resistor 84 and transistor 88 can be regarded as almost linear, the size of capacitor 80 plays a role only in that a larger capacitor means a longer charging time, i.e. a longer measurement time. The tolerances of capacitor 80 therefore have no influence on this type of measurement, and a very accurate fine digitization result is obtained.

If it is determined during the measurement in Phase=1 that voltage value Um at capacitor 80 is higher than 2.8 V, transistor 96 that connects node 78 to ground 54 via resistor 94 is then switched on by logic unit 44. Resistors 76 and 94 then constitute a voltage divider, and the voltage value to be measured at capacitor 80 is correspondingly reduced. The voltage at capacitor 80 can thereby be lowered into a range below 2.8 V so that a measurement becomes possible. The result must then be multiplied by a factor determined by the ratio between resistors 76 and 94.

| PREFERRED COMPONENT VALUES k = kOhms; voltage Uss = 3.1 V | |
|---|---|
| $\mu$C 20 | Microchip 16C621A |
| Comparator 66 | constituent of Microchip 16C621A |
| Resistor 52 | NTC: 100 k at 25□C |
| Resistor 58 | 510 k |
| Resistor 60 | 1 k |
| Resistor 64 | 110 k |
| Resistor 76 | 10 k |
| Resistor 84 | 1 k |
| Resistor 94 | 27 k |
| Capacitor 80 | 1 $\mu$F |

Figure 3:
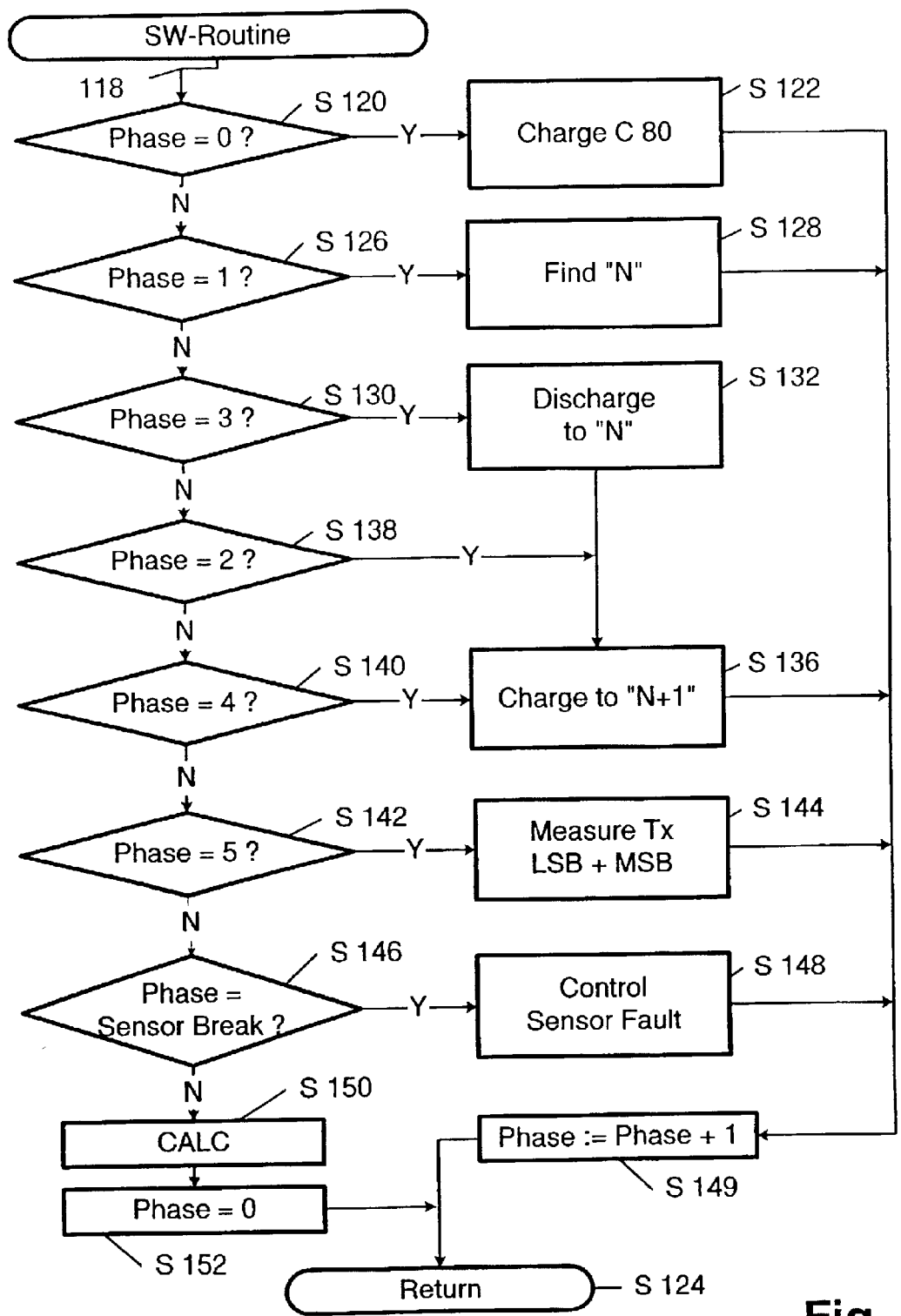
FIG. 3 is a flow chart explaining execution of the method.

FIG. 3 shows a preferred program routine for the measurement. It is preferably a component of a larger program, e.g. for controlling an electronically commutated motor. The construction of this "SW Routine" is based on the concept that only short program portions (modules), lasting e.g. less than 200 $\mu$s, are executed at each pass.

Firstly, after the beginning 118 of this routine, a test is made at S120 as to whether the program is in Phase=0. This is evident from the state of a higher-level phase counter or pointer that continuously cycles through the following states:

Phase=0
Phase=1
Phase=2
Phase=3
Phase=4
Phase=5
Phase=Sensor Break
Phase=0
Phase=1
etc.

This can also be referred to as a "state machine," i.e. in practice it is a variable in the processor's RAM that is continuously updated to the current state and indicates the present status of the target value identification process.

If the response in S120 is Yes, the program goes to S122 "Charge C," i.e. transistors 88, 90, and 96 are blocked so that capacitor 80 can charge to voltage value Um that is to be measured, and the program waits for a corresponding time. It then proceeds via S149 to the end S124 of this routine, and in S149 the phase counter is advanced from Phase=0 to Phase=1.

If the response in S120 is No, the program goes to S126, where it checks whether the pointer is at Phase=1. If Yes, then in S128 "Find "N"," the voltage range N containing the voltage to be measured at capacitor 80 is determined by switching electronic switches 102, 104, 106, etc. on and off. For example, if the voltage at capacitor 80 is 2.7 V, the voltage range N is between 2.6 and 2.8 V. This allocation to one of several voltage ranges results in a coarse digitization, yielding the most significant bits (MSBs) for digitization.

Once this voltage range has been determined, the program goes via S149 to the end S124 of the routine, and in S149 the phase counter is advanced to Phase=2.

If the response in S126 is No, the program goes to S130, where it checks whether the pointer is already at Phase=3. If Yes, then in S132 (Discharge to "N") capacitor 80 is discharged to the lower limit of voltage range N, i.e. to 2.6 V in the example described. The program then goes directly to S136 "Charge to N+1," where capacitor 80 is charged from 2.6 V (in this example) to the upper limit of voltage range N, i.e. to 2.8 V. Time T2 is measured in the process. The program then goes to the end S124 of the routine, and in S149 the phase counter is advanced to Phase=4.

If the response in S130 is No, the program goes to S138, where it checks whether the pointer is pointing to Phase=2. If Yes, the program goes to S136, where the capacitor 80 is charged from its instantaneous voltage Um that is to be measured to the upper voltage limit N+1 of voltage range N, i.e. to +2.8 V in the example described. Time interval T1 is measured in the process (cf. FIG. 2). The program then goes to the end S124 of the routine, and in S149 the phase counter is advanced to Phase=3.

If the response in S138 is No, the program goes to S140, where it checks whether the pointer is pointing to Phase=4. If Yes, then in S136 capacitor 80 is charged from the lower limit of voltage range N (i.e. from 2.6 V in this example) to the upper limit N+1 (i.e. to 2.8 V in this example); simultaneously, the time interval T2 is measured, as depicted in FIG. 2 and already described in detail therein. In S149 the phase counter is then advanced to Phase=5.

If the response in S140 is No, the program goes to S142, where it checks whether the pointer is pointing to Phase=5.

If Yes, the program goes to S144, where the least significant bits (LSBs) are calculated using equation (1) and are added to the most significant bits (MSBs) that were determined previously in S128. The voltage Um at capacitor 80 has then been digitized. In S149 the phase counter is then advanced to "Phase=Sensor Break."

If the response in S142 is No, the program goes to S146, where it checks whether the phase counter is pointing to "Phase=Sensor Break." If Yes, the program goes to S148 "CTRL Sensor Fault," where it checks whether the voltage at capacitor 80 has reached approximately the value Uss, which corresponds to an interruption in the connection to resistor 52. If so, an appropriate action is initiated, e.g. outputting of a fault or alarm signal; and in the context of a motor 156 for a fan 83, the rotation speed is increased to a value such that cooling is ensured in all situations. The program then goes via S149 to the end S124 of the routine.

If the response in S146 is No, the program goes to S150, where any desired program steps "CALC" can be executed. For example, the digital value calculated in S144 can be converted, using a table, into a different value corresponding to a desired motor rotation speed, and a moving average can be calculated from multiple measurements.

In S152 the pointer is then once again reset to Phase=0 so that at the next pass through the routine of FIG. 3, measurement begins again at S120.

Figure 4:
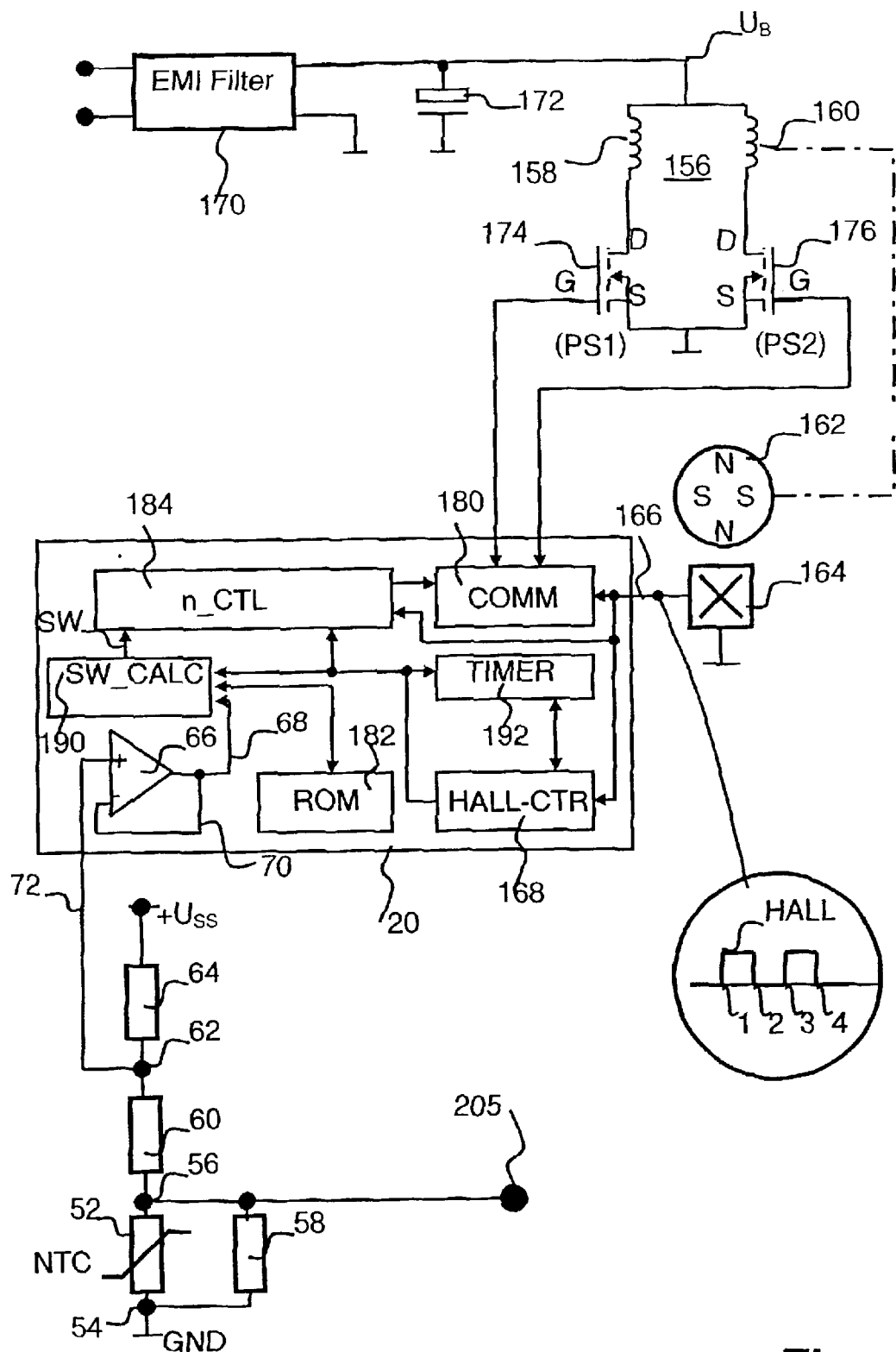
FIG. 4 is a diagram showing, by way of example, use of the invention in an electrically commutated motor 156.

FIG. 4 explains a preferred application of the invention in the context of an electronically commutated motor (ECM) 156 having two stator winding phases 158, 160 and a permanent-magnet rotor 162, which here is depicted with four poles and in whose vicinity is arranged a Hall generator 164 that, during operation, generates at its output 166 a square-wave HALL signal whose edges are labeled, by way of example, 1, 2, 3, 4. A Hall interrupt (FIG. 8) is generated at each of these edges, and the edges are continuously counted in a ring counter HALL_CTR 168.

Motor 156 has an EMI filter 170 and a filter capacitor 172 to supply it with a DC voltage $U_B$. A transistor 174 that serves as a first output stage (PS1) is in series with phase 158, and a transistor 176 that serves as a second output stage (PS2) is in series with phase 160. When transistor 174 is switched on, phase 158 receives current. When transistor 176 is switched on, phase 160 receives current.

Microcontroller (µC) 20 serves to control transistors 174, 176. A number of modules are depicted symbolically within it, including a module COMM 180 for commutation of motor 156; a ROM 182 (within or outside µC 20) to store the program for motor 156; a module n_CTL 184 for rotation speed control, which regulates the rotation speed of motor 156 via module 180; and also a module SW_CALC 190 for calculating target value SW that is delivered to rotation speed controller 184. The present value of the rotation speed, i.e. instantaneous or actual value IW, is conveyed in the form of the HALL signal to controller 184, and also to modules 180 and 168. µC 20 also contains a timer 192 that can be conceived of here as a clock that, at any desired point in time, supplies a so-called baseline time. Timer 192 coacts with modules 168, 184, and 190.

A voltage for calculating target value SW is delivered to module 190 via impedance converter 66. Its positive input 72 receives the signal from node 62 of a voltage divider 52, 58, 60, 64, which is described in detail in FIG. 1 (cf. description therein).

The signal at output 68 of impedance converter 66 is converted in module 190, in accordance with FIGS. 1 through 3, into a target value, i.e. into a desired rotation speed. For example, motor 156 might run at 1500 rpm when the temperature at resistor 52 is 20° C., and at 3500 rpm when that temperature is 60° C. A target value in the form of a voltage can also be conveyed to node 56 from outside, via input 205.

Figure 5:
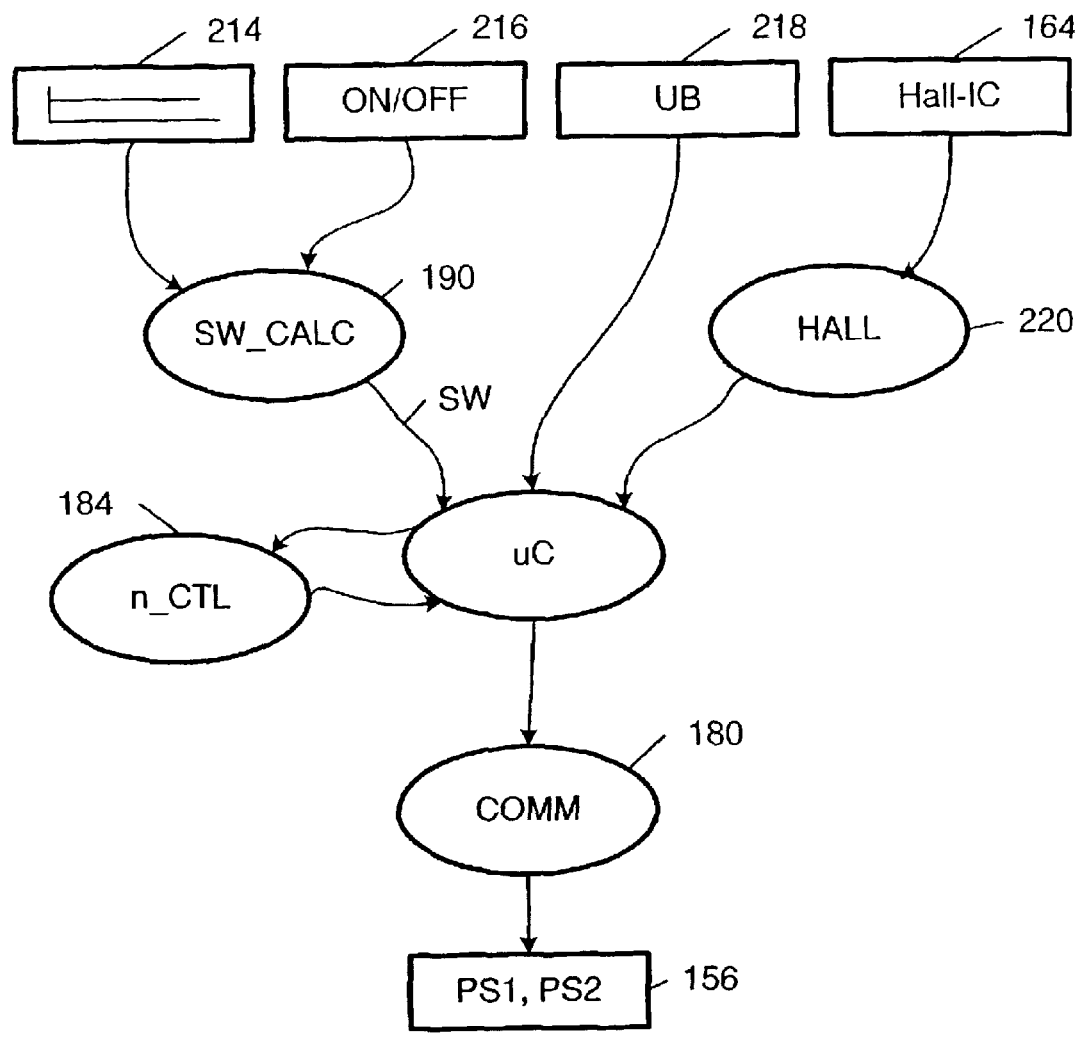
FIG. 5 is an overview of the program structure.

FIG. 5 shows how the individual functions interact with one another in a motor of this kind.

At 214, a signal is generated at NTC (Negative Temperature Coefficient) resistor 52 and is processed in module 190 to yield the target or "should be" value SW.

At 216, ON/OFF signals for switching motor 156 on or off are delivered, and they also pass through module 190.

At 218, operating voltage $U_B$ is delivered; this can be taken into account, for example, in such a way that if the operating voltage is too low, the motor is shut off, or if the operating voltage is too high, certain changes are made in the program.

Block 164 depicts Hall IC 164 that generates the HALL signal, which is processed in a processing module 220 and supplies information about the instantaneous position and rotation speed of rotor 162.

Lastly, commutation module 180 is provided; this controls the two output stages PS1, PS2 in motor 156.

FIG. 5 shows that interactions exist between the individual modules that may need to be taken into account in the configuration of the program if the latter is used in an ECM 156.

Figure 6:
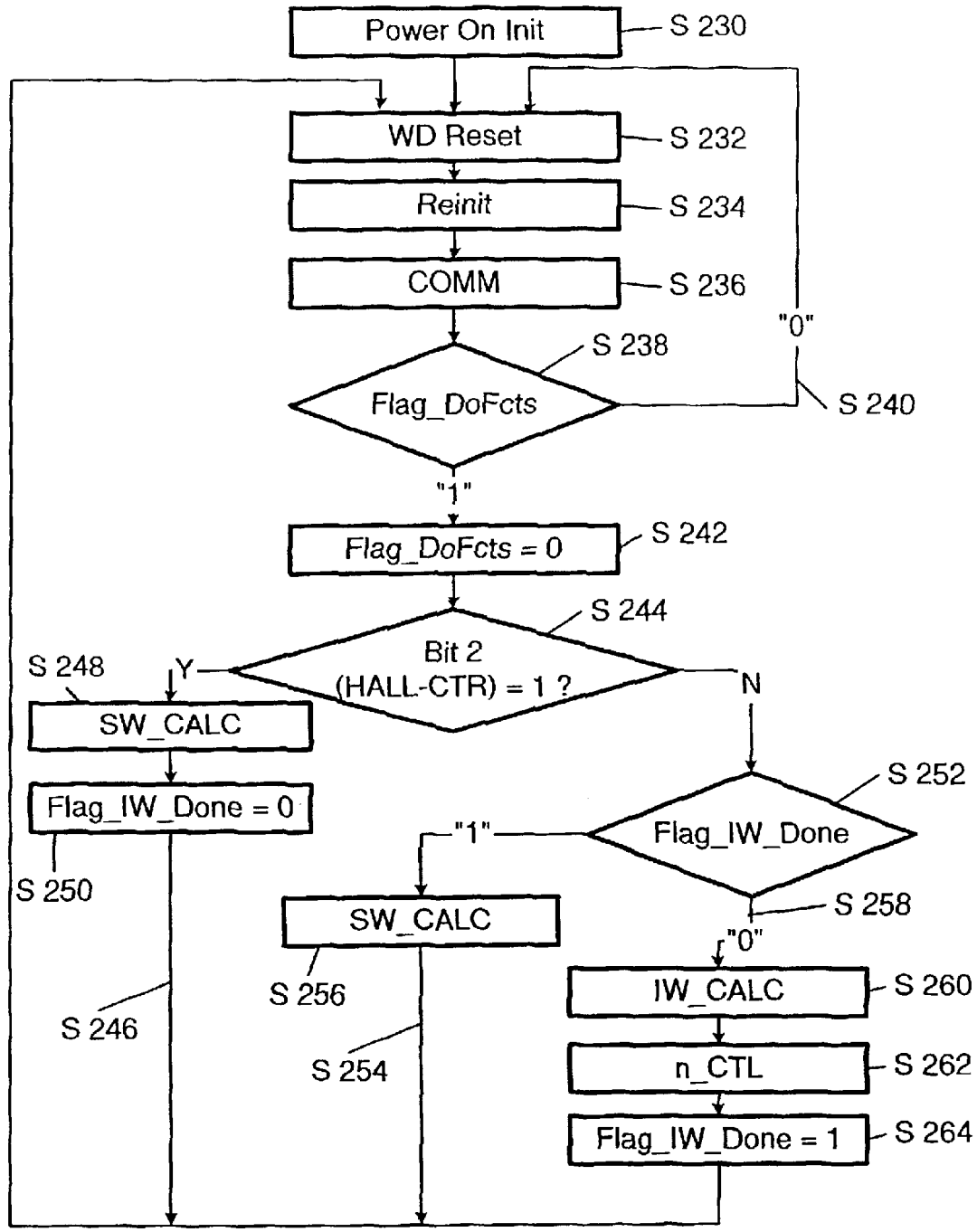
FIG. 6 shows the basic structure of a program for controlling a motor and substantially simultaneously acquiring a target value.

FIG. 6 shows the typical basic structure of a program that is preferably used to control the various functions of motor 156.

In step S230, an initialization occurs upon startup; during this, various parameters are set to initial values. In step S232, watchdog WD of computer 20 is reset, and in step S234 a reinitialization of certain values occurs at each pass in order to prevent $\mu$C 20 from crashing. At S236, commutation is controlled. In step S238, a Flag_DoFcts is tested; if it has a value of 0, the program proceeds via a short loop 240 back to S232. If the flag has a value of 1, it is reset to 0 in step S242. This flag (S238) is set to 1 at each Hall interrupt (FIG. 8), i.e. in FIG. 4 at points 1, 2, 3, 4 of the HALL signal.

In the next step S244, bit 2 of HALL_CTR 168 is tested.

As depicted in FIG. 7, the two rightmost bits of this binary ring counter follow the numerical sequence 00-01-10-11-00 etc. If bit 2 has a value of 1, the program branches to the left into a branch 246. If it has a value of 0, it branches to the right. Next in left branch 246, at S248, is one of the target value identification phases as described in FIGS. 1 through 3, and at S250 Flag_IW_Done is set to 0. The program then goes back to step S232.

If the response in S244 is No, the program then goes to step S252 where it checks the value or Flag_IW_Done. If the latter has a value of 1, the program goes to loop 254 where it executes, in a step S256, one of the target value identification phases SW_CALC described in FIGS. 1 through 3, and then goes back to S232.

If the value of Flag_IW_Done in S252 is 0, the program enters the right-hand loop 258. Instantaneous value identification IW_CALC is performed there in step S260, i.e. the instantaneous rotation speed of motor 156 is acquired as a digital value.

Then, in step S262, rotation speed control n_CTL is performed on the basis of the acquired instantaneous value and acquired target value; then Flag_IW_Done is set to 1 in S264, and the program goes back to S232.

When motor 156 is running, one of the three long loops 246, 254, or 258 is executed once at each change in the HALL signal. Subsequently, until the next change in HALL, only the short loop 240 is repeated at frequent time intervals, e.g. every 100 $\mu$s.

Since identification and calculation of the target value, as described in FIGS. 1 through 3, takes a long time, it has advantageously been divided between loops 246 and 254. As FIG. 7 shows, branch 246 is run through twice for each complete revolution of four-pole rotor 162, branch 254 once, and branch 258 also only once. For each revolution, therefore, one of the target value calculation phases SW_CALC is executed at three of the changes of the HALL signal, and an instantaneous value identification IW_CALC is performed at one change of the HALL signal. It is advantageous, in this context, that identification of the instantaneous value can be accomplished using the values of one complete rotor revolution, which is substantially more accurate than identification over only one-quarter of a revolution.

The three branches 246, 254, and 258 are preferably designed so that they each take approximately the same time to execute.

It should be noted that in steps S248, S256 of FIG. 6, the target value identification phase executed in each case is the one indicated at that moment by the phase counter described above. It may happen, for example, that in step S256 Phase=0 is executed at one pass, Phase=3 at the next pass, Phase=Sensor Break at the next pass, etc. Complete identification of the target value is thus distributed over approximately two rotor revolutions, which is sufficiently accurate because there is little change in the target value during this short period. Calculation of the target value takes a fairly long time, but because of this distribution over two revolutions it can be broken down into several small pieces, and then does not interfere with the commutation of motor 156.

Figure 8:
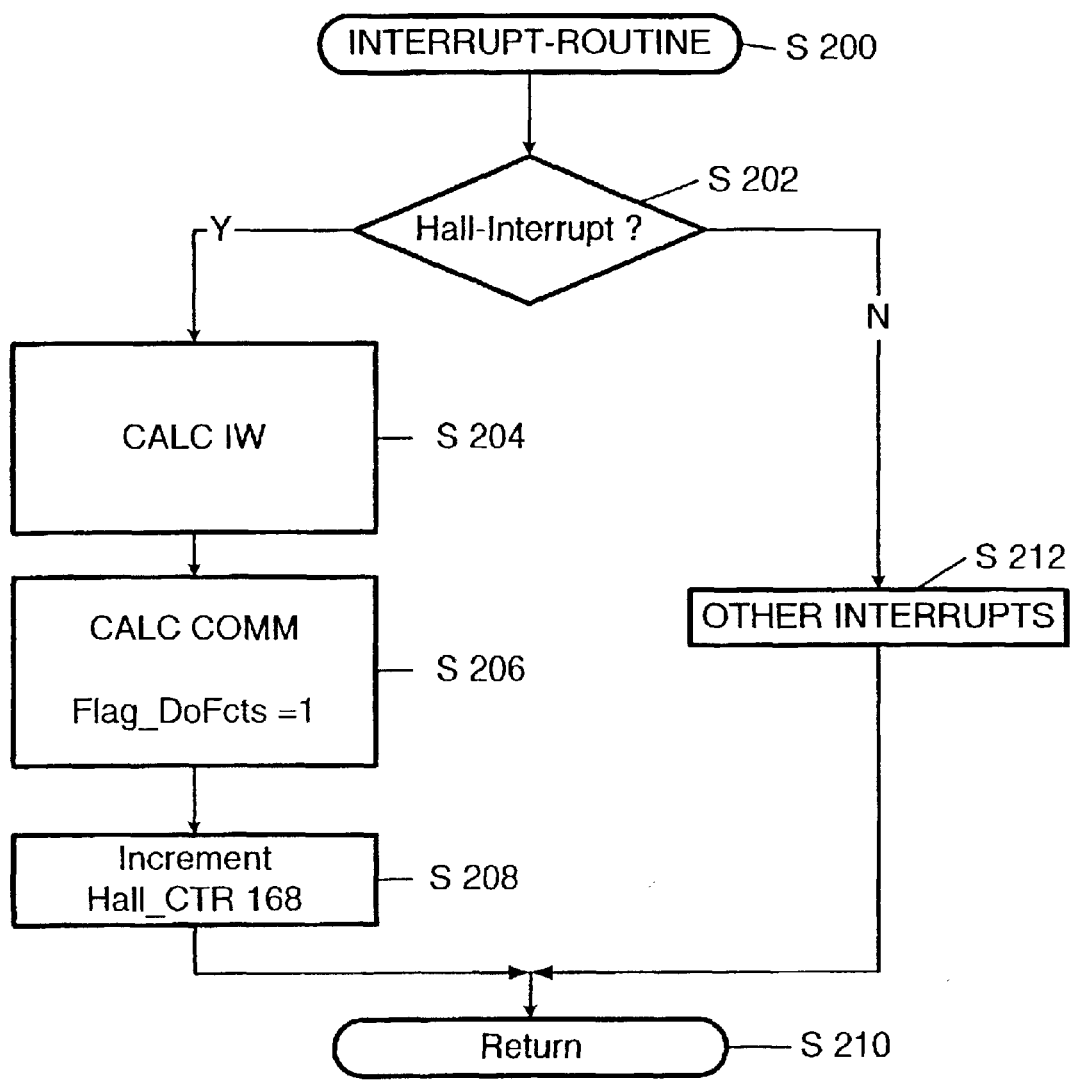
FIG. 8 is the flow diagram of an interrupt service routine.

FIG. 8 shows a routine S200 that is executed subsequent to interrupts that interrupt program execution.

FIG. 4 shows the HALL signal, four edges 1, 2, 3, 4 of which are depicted. Interrupt routine S200 of FIG. 8 is called at each of these edges so that TIMER 192 (FIG. 4) can accurately measure the point in time at which the relevant edge has occurred.

For example, if edge 1 has occurred at t1=64,327 $\mu$s, and edge 2 at t2=65,400 $\mu$s., the time required by rotor 162 to rotate between edge 1 and edge 2, i.e. one-quarter of a revolution, was therefore $$t2-t1=65,400-64,327=1073 \ \mu s \quad (2)$$

Rotor 162 therefore requires $$4*1073=4292 \ \mu s=0.004292 \text{ second for one complete revolution.}$$

This yields a rotation speed of $$1/0.004292=232.99 \text{ rps}=60*232.99=13,979.5 \text{ rpm} \quad (3)$$

Instantaneous value IW of the rotation speed can therefore be calculated very accurately in this fashion. A prerequisite, however, is that times t1, t2, . . . be measured very accurately. These times are also needed for precise commutation control.

When an interrupt occurs, the program first checks in S202 whether a Hall interrupt, i.e. one of the edges of the HALL signal, is present. This Hall interrupt has the highest priority, and interrupts all other program sequences. If Yes, the program goes to S204, where it calculates the actual or instantaneous value IW of the rotation speed, usually in accordance with the aforementioned equation (2), i.e. as the time instantaneously required by rotor 162 to rotate through a defined rotation angle.

In S206 "CALC COMM," calculations are then performed to control commutation; and Flag_DoFcts, which controls the calculation operations in steps S238, S242 of FIG. 6, is set to 1, so that one of the lower loops 246, 254, or 258 of FIG. 6 is run through once at each Hall interrupt. Optionally, a second or even a third condition can be tested in S238 (FIG. 6) so that lower loops 246, 254, or 258 can be executed at a desired point in the rotor revolution, as described in the commonly assigned German patent application 101 616 88.0 of Dec. 15, 2001 (German attorney docket no. 254; Assignee docket no. 3069).

In S208, Hall counter HALL_CTR 168 (FIG. 4) is then incremented by 1 as described in FIG. 7. The routine then goes to S210 Return.

If the response in S202 is No, the program then goes to S212, determines which other interrupt is present, executes it, and then once again goes to S210 Return.

Interrupt routine S200 of FIG. 8 thus serves principally to measure very exactly the times of edges 1, 2, 3, 4, . . . of the HALL signal (FIG. 4), since an exact measurement of this kind is a prerequisite for smooth operation of motor 156 at the desired rotation speed. At the same time, the setting of Flag_DoFcts in S206 and the incrementing of the Hall counter in S208 determine which one of loops 246, 254, or 258 of FIG. 6 will be executed next; as a result, the calculation tasks to be performed can be fitted optimally into the available calculation time and performed at the correct rotational position of rotor 162.

As an aid to understanding, the flow diagram of FIG. 6 can be explained as follows:

The test in S238 is like a first "traffic lights." Controlled by the rotational position of rotor 162, it is "green" four times during each rotor revolution (e.g., in the exemplary embodiment, at those points where an edge of the HALL signal occurs) and in that case steps S242 and S244 are accessed. The rest of the time the S238 light is "red," so that loop 240 is run through at very frequent intervals.

The next traffic light is S244. It is controlled by the second bit of Hall counter 168, as depicted in FIG. 7. The result is as if this light were controlled by the rotor rotation through a reduction gear drive.

If this traffic light is green (YES), then loop 246 is executed (cf. FIG. 7). If it is red (NO), the routine then goes to S252, where the program branches either to loop 254 or to loop 258.

After each of loops 246, 254, or 258, the program goes back to S232.

At defined rotational positions of rotor 162, it is thus possible to execute specific program steps that are required there, e.g. steps S232, 234, 236 for commutation, which must be performed with fairly high accuracy within the time ranges in which a commutation action is expected. As regards the steps necessary in order to control rotation speed (S262) or to calculate parameters for the rotation speed control system (S248, S256, S260), it is sufficient to execute them once every rotor revolution or once every two rotor revolutions, since the rotation speed changes little during that time period.

Many variations and modifications are of course possible within the scope of the present invention. For example, the measurement could also be performed in such a way that the two time intervals T1 and T2 are measured not upon charging of capacitor 80, but upon discharging. In this instance as well, the size of capacitor 80 has no influence on measurement accuracy, so capacitor manufacturing variations are not critical or troublesome. Thus, the invention is not limited to the specific embodiments shown and described, but rather is defined by the following claims.

What is claimed is:

1. A method of digitizing a voltage, comprising the steps of providing a capacitor (80) and an impedance, charging said capacitor, through said impedance, to a voltage value (Um) which is a function of the voltage to be digitized;

ascertaining within which one of a plurality of voltage ranges said voltage value (Um) lies, each voltage range being defined by a respective first limit and respective second limit;

providing a charge modification circuit containing an impedance, modifying, by means of said charge modification circuit, the voltage at the capacitor to the first limit, and ascertaining a first time interval needed therefor;

modifying, by means of the charge modification circuit, the voltage at the capacitor from the first limit to the second limit, and ascertaining a second time interval needed therefor;

calculating, based on the first time interval and second time interval, a digital value which serves as an indication of how much the voltage value (Um) at the capacitor differs from one of the two limits of the ascertained voltage range;

further providing a resistor chain in the form of a series circuit of resistors connected via a connecting point, applying a substantially constant voltage to said resistor chain, successively comparing the respective potentials at the connecting points to the voltage value (Um) at the capacitor, in order to determine the first limit and the second limit of one of said voltage ranges, providing a resistor (94) for connection in parallel with said capacitor (80), testing whether the voltage value (Um) at the capacitor is greater than the potentials at all the connecting points of the resistor chain and, if so, completing a circuit path (78, 94, 96, 54) including said resistor in parallel with the capacitor (80), in order to reduce the voltage value at said capacitor; and thereafter again comparing the potentials at the connecting points to the voltage value (Um) at the capacitor, in order to determine the first limit and the second limit.

2. The method of claim 1, wherein said step of charging said capacitor comprises connecting an impedance converter, having an input and an output, to a voltage source and using an output signal of said impedance converter to charge said capacitor.

3. In a method of digitizing a voltage, comprising the steps of providing a capacitor and an impedance, charging said capacitor through said impedance to a voltage value (Um) which is a function of the voltage to be digitized;

ascertaining within which one of a plurality of voltage ranges said voltage value (Um) lies, each voltage range being defined by a respective first limit and respective second limit;

providing a charge modification circuit containing an impedance, modifying, by means of said charge modification circuit, the voltage at the capacitor to the first limit, and ascertaining a first time interval needed therefor;

modifying, by means of the charge modification circuit, the voltage at the capacitor from the first limit to the second limit, and ascertaining a second time interval needed therefor;

calculating, based on the first time interval and second time interval, a digital value which serves as an indication of how much the voltage value (Um) at the capacitor differs from one of the two limits of the ascertained voltage range, further providing a routine whose program steps are adapted to control an electric motor, and executing said routine between said step of ascertaining the first time interval and said step of ascertaining the second time interval.

4. A method of digitizing a voltage, comprising the steps of
providing a capacitor and an impedance,
charging said capacitor, through said impedance, to a voltage value (Um) which is a function of the voltage to be digitized;
ascertaining within which one of a plurality of voltage ranges said voltage value (Um) lies, each voltage range being defined by a respective first limit and respective second limit;
providing a charge modification circuit containing an impedance,
modifying, by means of said charge modification circuit, the voltage at the capacitor to the first limit, and ascertaining a first time interval needed therefor;
modifying, by means of the charge modification circuit, the voltage at the capacitor from the first limit to the second limit, and ascertaining a second time interval needed therefor;
calculating, based on the first time interval and second time interval, a digital value which serves as an indication of how much the voltage value (Um) at the capacitor differs from one of the two limits of the ascertained voltage range;
further providing a routine adapted for controlling an electric motor, and
executing, between said ascertaining of said second time interval and said calculating based on the first time interval and the second time interval, said motor controlling routine.

5. An arrangement for digitizing a voltage, said arrangement comprising:
a capacitor;
a charging circuit having an input connected to a voltage to be digitized, said charging circuit including an impedance which charges said capacitor to a voltage value (Um) which is a function of the voltage to be digitized;
a microprocessor for coarse classification of said voltage value (Um) into one of a plurality of voltage ranges, which voltage ranges are each defined by a respective first limit and a respective second limit;
a charge modification apparatus for modifying the voltage at the capacitor to the first limit of the voltage range identified by said coarse classification and for measuring a first time interval needed for such modification;
a charge modification apparatus for modifying the voltage at the capacitor to the second limit of the voltage range identified;
a charge modification apparatus for modifying the voltage at the capacitor from the second limit to the first limit and for measuring a second time interval needed therefor; and a calculation apparatus for calculating a second digital value, based upon values of the first time interval and the second time interval, and for calculating, from a digital value obtained by coarse classification and from the second digital value, a combined digital value that has a greater accuracy than the value obtained by coarse classification.

6. The arrangement according to claim 5,
wherein the microprocessor serves to control at least one charge modification apparatus.

7. The arrangement according to claim 5,
wherein a measurement range switchover apparatus, controlled by the microprocessor, is provided, and is activated if the voltage value (Um) at the capacitor is outside the available voltage ranges.

8. The arrangement according to claim 5,
wherein there is provided, in the charging circuit of the capacitor, an impedance converter which is controllable on an input side thereof by a voltage source whose analog voltage is to be transformed into a digital signal.

9. The arrangement according to claim 5, further comprising
means (184), coupled to an output of said calculation apparatus (190), for temperature-dependent control of the rotation speed of a fan.

10. The arrangement according to claim 9, wherein
said capacitor voltage value for digitization represents a temperature, and
an output signal of said arrangement for digitizing serves for temperature-dependent control of the rotation speed of a fan.

11. The arrangement according to claim 9,
wherein the means (184) for rotation speed control is controlled (166) by the instantaneous position (164) of the rotor of a motor driving the fan.

12. An arrangement for digitizing a voltage, said arrangement comprising:
a capacitor;
a charging circuit having an input connected to a voltage to be digitized, said charging circuit including an impedance which charges said capacitor to a voltage value (Um) which is a function of the voltage to be digitized;
an electric motor;
a microprocessor for coarse classification of said voltage value (Um) into one of a plurality of voltage ranges, which voltage ranges are each defined by a respective first limit and a respective second limit, and for controlling commutation of said electric motor;
a program for execution by the microprocessor, said program comprising a plurality of program calls for the digitization process, each program call being adapted for executing part of the digitization process;
a charge modification apparatus for modifying the voltage at the capacitor to the first limit of the voltage range identified by said coarse classification and for measuring a first time interval needed for such modification;
a charge modification apparatus for modifying the voltage at the capacitor to the second limit of the voltage range identified;
a charge modification apparatus for modifying the voltage at the capacitor from the second limit to the first limit and for measuring a second time interval needed therefor; and
a calculation apparatus for calculating a second digital value, based upon values of the first time interval and the second time interval.

* * * * *